US011164542B1

(12) United States Patent
Reckwerdt, Jr. et al.

(10) Patent No.: US 11,164,542 B1
(45) Date of Patent: Nov. 2, 2021

(54) IMAGE PROCESSING SYSTEM FOR A DIGITAL DISPLAY

(71) Applicants: Wilbur Arthur Reckwerdt, Jr., Saratoga, CA (US); Kam Fai Wang, San Francisco, CA (US)

(72) Inventors: Wilbur Arthur Reckwerdt, Jr., Saratoga, CA (US); Kam Fai Wang, San Francisco, CA (US)

( * ) Notice: Subject to any disclaimer, the term of this patent is extended or adjusted under 35 U.S.C. 154(b) by 0 days.

(21) Appl. No.: 16/987,425

(22) Filed: Aug. 7, 2020

(51) Int. Cl.
  *G09G 5/10* (2006.01)
  *H03M 3/00* (2006.01)

(52) U.S. Cl.
  CPC ............... *G09G 5/10* (2013.01); *H03M 3/30* (2013.01); *H03M 3/502* (2013.01); *G09G 2320/0233* (2013.01); *G09G 2320/0238* (2013.01); *G09G 2320/0271* (2013.01); *G09G 2340/00* (2013.01); *H03F 2200/345* (2013.01); *H03M 3/46* (2013.01)

(58) Field of Classification Search
  CPC ............ G09G 5/10; G09G 2320/0271; G09G 2320/0233; G09G 2320/0238; G09G 2340/00; H03M 3/30; H03M 3/502; H03M 3/46; H03F 2200/345
  See application file for complete search history.

(56) References Cited

U.S. PATENT DOCUMENTS

| 2012/0268655 | A1* | 10/2012 | MacInnis ............ G06F 16/9577 348/584 |
| 2016/0028380 | A1* | 1/2016 | Townsend ............... H03M 1/12 327/172 |
| 2017/0039926 | A1* | 2/2017 | Greer, III ............... G09G 3/001 |
| 2017/0070237 | A1* | 3/2017 | Ardalan .................. H03M 3/42 |
| 2019/0165820 | A1* | 5/2019 | Xu ........................ H03M 3/502 |

* cited by examiner

*Primary Examiner* — Brent D Castiaux
(74) *Attorney, Agent, or Firm* — Bayramoglu Law Offices LLC

(57) ABSTRACT

A device and method of an image processing system where a Delta Sigma Pulse Density Modulation is used for digital displays, where the digital displays are emissive or non-emissive. The device and method a digital driving solution using Delta Sigma Encoding where N bit-per-component symbols at F1 frame-rate-per-second are represented using M bits-per-component symbols at F2 frame-rate-per-second, where $N \geq M$ and $F2 \geq F1$.

14 Claims, 11 Drawing Sheets

IMAGE PROCESSING SYSTEM FOR A DIGITAL DISPLAY

TECHNICAL FIELD

The present disclosure relates to an image processing system and method thereof using a Delta Sigma (ΔΣ) Pulse Density Modulation (PDM). More particularly, an image processing system and method used in digital displays.

BACKGROUND

A non-emissive display, which is sometimes called transmissive, reflective or passive, uses optics to bend light. A light source such as a light-emitting diode (LED), miniLED or sunlight is bent. The primary non-emissive display is a Liquid Crystal Display (LCD), which is used in automotive, TVs, and signage, but there are others like digital light processing (DLP) or liquid crystal on silicon (LCoS). LCD's are easy to manufacture, but cannot produce true black, suffer from color inversion (i.e. poor viewing angle) and are not energy efficient. A typical LCD is shown in FIG. 8. These displays emit between 4%-8% of the backlight energy making them very inefficient. The polarizer blocks 50% of the light; the color filters block another 66% of the light (allowing Red Green or Blue colors through one at a time); and a thin-film transistor (TFT) active array blocks 50% of the light.

An emissive display converts electrical energy into light. Each pixel emits light and each pixel can turn on/off individually. Emissive displays are distinguished by a deep black level, high contrast and fast response time. The primary emissive display method is an organic light-emitting diode (OLED), which is used in smartphones, tablets, laptops and televisions, but there are others such as MicroLED (μLED) and Plasma. OLED's are difficult to manufacture and suffer from color balance and uniformity issues especially for the color blue. Non-uniformity is where adjacent pixels look different and therefore uniformity means having adjacent pixels look the same. Many techniques have been proposed to address the color balance issue which include using white OLEDs with a color filter as shown in FIG. 9 and making the blue and red OLED material larger than the green as shown in FIG. 10. Similar to a Liquid Crystal Display (LCD), the white OLED with a color filter blocks 66% of the energy; making it less efficient. Making the material different sizes is difficult to control during manufacturing, which increases the non-uniformity.

The display consists of a series of pixels laid out in a grid of rows and columns which are driven by a display drive. A display driver modulates the pixels normally using a 6 bit-per-component (bpc) or 8 bit-per-component (bpc) interface. The typical modulation scheme is binary-weighted pulse width modulate (PWM), which divides an N-bit sub-pixel into ($2^N$) equal steps (for example, N=6 for a 6-bit driver). If the data bit=0, then no light is emitted. If the data bit=63, then full light is emitted. The viewer's eye integrates the light pulses. The amount of time to write a pixel depends on the display's frame rate and resolution. As the frame rate resolution is increased, the system speed must also increase to be able to write the pixels faster (i.e. it requires the PWM to resolve the pixels faster). One problem encountered by PWM display systems is the creation of lateral field contouring (false contouring). This is caused by either looking at stationary objects with the viewer's eyes moving or looking at moving objects where the light intensity suddenly jumps temporally. To alleviate this issue, the bit-depth (N) needs to be increased. Increasing bit-depth (N) leads to two problems: the total power must increase. The total power is calculated by the formula $P_{total}=P_{step}*2^N$, where $P_{step}$ is the power required per step and * means multiplication. Here, the PWM circuit needs to run faster to resolve $2^N$ steps. Many approaches have been tried to compensate for this problem, but all those approaches tried added complexity, reduce the grey levels, and brightness of the display.

Thus, there is a present need for a display technology which fixes uniformity, color balance, color inversion and at the same time produces bright, clear and colorful images while reducing power consumption. The present disclosure and invention take a novel approach of introducing a Delta Sigma (ΔΣ) Pulse Density Modulation (PDM) circuit which solves the problems mentioned above. The Delta Sigma PDM builds an image over time, is frameless, and has no spatial properties. A Delta Sigma PDM circuit requires a constant time, dependent on N, to resolve the least significant bit (LSB). The disclosed invention and technology uses less bits-per-component, as it builds the image over time.

SUMMARY

The present disclosure is an image processing system and a method implemented in a display driver, using a modulation and relates to changing the way that videos and/or images are displayed by using Delta Sigma (ΔΣ) Pulse Density Modulation (PDM). N-bits at a frame rate of F1 are converted to M-bits at a frame rate of F2 where N≥M and F2≥F1. The advantages of this approach are reduction in power consumption, correcting uniformity, obtaining a faster display, compressing data to reduce bandwidth, and fixing color inversion.

Reducing power consumption is achieved by using less bits (M) to draw the same image over time. Referring to Table 1, M-bits are required to build an equivalent image to N-bits. Using $P_{total}=P_{step}*2^N$, we replace N with M; where M≤N. This reduces the $P_{total}$ by $2^N/2^M$.

TABLE 1

N versus M at various frame rates

| F1 = 30 fps/N | F2 = 60 fps/M | F2 = 120 fps/M | F2 = 240 fps/M | F2 = 420 fps/M |
|---|---|---|---|---|
| 6 bpc | 2 bpc | 1 bpc | 1 bpc | 1 bpc |
| 8 bpc | 4 bpc | 3 bpc | 2 bpc | 1 bpc |
| 10 bpc | 6 bpc | 5 bpc | 4 bpc | 3 bpc |

Correcting uniformity is achieved by increasing the bit-depth. Normally, the increase must be to 11-13 bits. Building a display driver to handle this bit-depth is costly and requires more power. Referring to Table 2, setting M=to the display drivers limit (normally 6-bit or 8-bit), generates a higher effective bit-depth which can be used to correct for non-uniformity.

TABLE 2

M bit depth looks equivalent to X at 30 fps

| Effective bit-depth | F2 = 60 fps/M | F2 = 120 fps/M | F2 = 240 fps/M | F2 = 420 fps/M |
|---|---|---|---|---|
| 13 bpc | 9 bpc | 8 bpc | 7 bpc | 6 bpc |
| 12 bpc | 8 bpc | 7 bpc | 6 bpc | 5 bpc |

TABLE 2-continued

M bit depth looks equivalent to X at 30 fps

| Effective bit-depth | F2 = 60 fps/M | F2 = 120 fps/M | F2 = 240 fps/M | F2 = 420 fps/M |
|---|---|---|---|---|
| 11 bpc | 7 bpc | 6 bpc | 5 bpc | 4 bpc |
| 10 bpc | 6 bpc | 5 bpc | 4 bpc | 3 bpc |

Making displays run faster is desired to reduce eye fatigue and to sell to the gaming markets. Delta Sigma PDM requires less time to resolve the least significant bit (LSB) when compared to PWM. The system has to meet the human eyes integration time, which is 0.6 seconds. This translates into 420 fps to resolve N=8-bpc using M=1-bpc (Refer to Table 3 and FIG. 6).

TABLE 3

Time to resolve the LSB

| N | Resolve LSB PWM | Resolve LSB Delta Sigma PDM |
|---|---|---|
| 8 bpc, 1080 P@120 Hz | 30 ns | 1150 ns |
| 10 bpc 1080 P@120 Hz | 7.5 ns | 290 ns |

To reduce the overall bandwidth, it is not necessary to make an equivalent image. Several factors can decrease the bandwidth without making a noticeable difference. One factor is the human eye. Since the eye's fovea has more red and green cones (96% of the 6-7 million cones) and blue is naturally blurry as most if its cones are outside of the fovea, it is best to apply a greater bits-per-component for the color green followed by red and then blue. This is done by setting M=3 for Green (Equivalent image at 120 Hz from Table 1) and M=2 for Red and Blue (less than equivalent by 1 bit). Another factor is cones allow us to see detail and most cones are concentrated in the fovea centralis (center). It is natural to concentrate more bits-per-component in the center. This can be done by dividing the image as shown in FIG. 4.

Fixing color inversion is achieved by reducing the amount of light emitted by the light source. Referring to Table 1, 1 bpc is equivalent to 6 bpc using a 120 Hz or higher display. Fixing color inversion occurs by setting M=1, which turns the light on or off (FIG. 7 shows an image of 1-bpc as the viewer looks parallel to the display).

As shown in FIG. 1, the image/video is converted to Delta Sigma PDM. The inputted video is (N) bit-per-component (bpc) at (F1) frame rate per second (fps). The output will be at the desired (M) bpc symbols at (F2) fps. The ratio of F2/F1 is known as oversampling frequency. As the oversampling frequency increases, fewer bits-per-component (M) are needed to display the video.

BRIEF DESCRIPTION OF THE DRAWINGS

In order to more clearly illustrate the embodiments of the present disclosure, a brief description of the drawings is given below. The following drawings are only illustrative of some of the embodiments of the present disclosure and for a person of ordinary skill in the art, other drawings or embodiments may be obtained from these drawings without an inventive effort.

DETAILED DESCRIPTION

Figure 3:
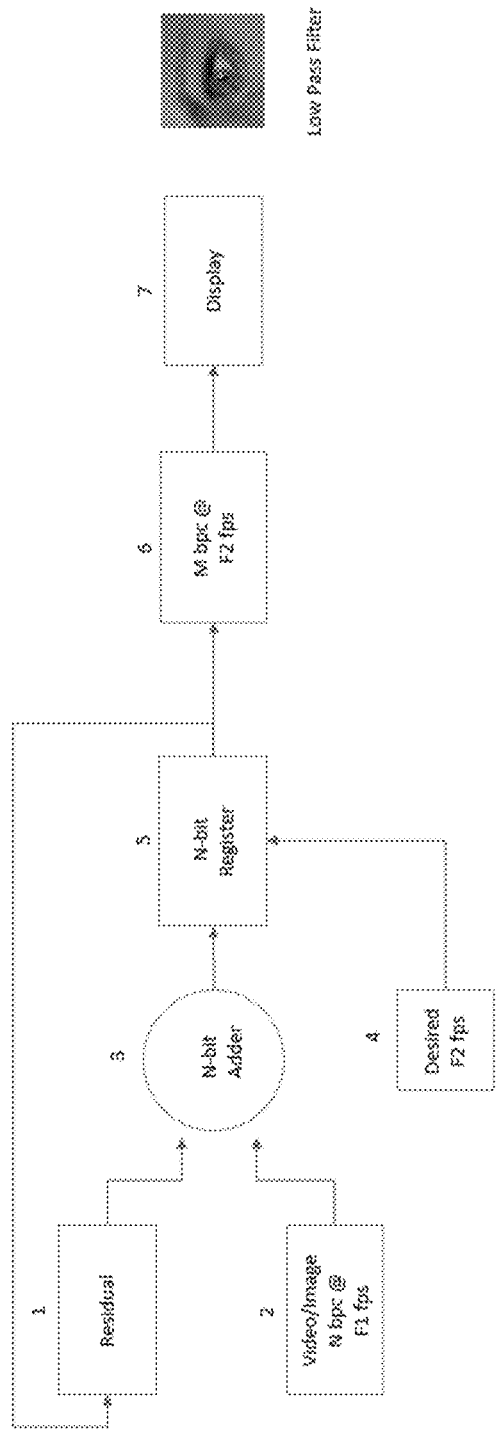
FIG. 3 is the diagram showing the oversampler implemented as an N-bit adder.

The invention is an image processing system or method implemented within a display driver and is a novel way to display images—whether still or moving. As the modulation scheme within the image processing system, the invention uses Delta Sigma ($\Delta\Sigma$) Pulse Density Modulation (PDM). The system uses $\Delta\Sigma$ PDM and oversamples the input therefore, breaking the input into digital components (FIG. 3). The oversampling frequency must be at least 2 times the input frequency. The digital components can be represented using 1-bit, 2-bits, 3-bits and so on and this is known as the bit-depth. Using $\Delta\Sigma$ PDM, the images are created over time and the human eye (or a camera) integrates them. The implementation is quite simple, for each subpixel a loop is created running at the output frequency. The subpixel value is added to the summation from the previous iteration of the loop. If the new summation overflows, output is a 1 (high pulse); if it does not, output is a 0 (low pulse). A series of shifters and adders are implemented by using different technologies for example using a semiconductor-based technology.

The $\Delta\Sigma$ PDM output is not an image. In fact, the output has no frame properties (it is frameless). They output after the eye integrates is an image. The image quality produced by $\Delta\Sigma$ PDM depends on oversampling frequency and the bit-depth of the digital component (refer to Table 1 and Table 2). As the bit-depth decreases, the oversampling frequency must increase.

Since the human eye is the integrator, the image must be resolved within the human eye integration time which is 0.6 seconds. This makes $\Delta\Sigma$ PDM faster than PWM (refer to Table 3). The advantages of this approach reduce power consumption, corrects uniformity, obtains faster display, provides compressing to reduce bandwidth, and fixes color inversion.

The technical solutions of the present disclosure will be clearly and completely described below with reference to the drawings. The embodiments described are only some of the embodiments of the present disclosure, rather than all of the embodiments. All other embodiments that are obtained by a person of ordinary skill in the art on the basis of the embodiments of the present disclosure without an inventive effort shall be covered by the protective scope of the present disclosure.

In the description of the present disclosure, it is to be noted that the orientational or positional relation denoted by the terms such as "center", "upper", "lower", "left", "right", "vertical", "horizontal", "inner" and "outer" is based on the orientation or position relationship indicated by the figures, which only serves to facilitate describing the present disclosure and simplify the description, rather than indicating or suggesting that the device or element referred to must have a particular orientation, or is constructed or operated in a particular orientation, and therefore cannot be construed as a limitation on the present disclosure. In addition, the terms "first", "second" and "third" merely serve the purpose of description and should not be understood as an indication or implication of relative importance.

In the description of the present disclosure, it should be noted that unless otherwise explicitly specified and defined, the terms "install", "link" and "connect" shall be understood in the broadest sense, which may, for example, refer to fixed connection, detachable connection or integral connection; may refer to mechanical connection or electrical connection; may refer to direct connection or indirect connection by means of an intermediate medium; and may refer to communication between two elements. A person of ordinary skill in the art would understand the specific meaning of the terms in the present disclosure according to the specific situations.

Definition of Terms

Banding is a sudden, unwanted, jump in color and/or brightness where none is meant to be. Increasing the bits-per-component decreases banding by producing more levels of color.

Dithering hides banding by noisily transitioning from one color to another. This does not increase the bits-per-component.

Non-uniformity/Mura defects are spatial variations, irregularities and "clouding" effects seen in brightness. These are caused by the backlight (LCD) or pixel-pixel variations (OLED) due to process fabrication. The display must be able to divide the voltage or current into $2^{bpc}$ steps. To display additional bits-per-component, the display's power must increase. In many applications, this is not possible.

Pixel is a point within the image. A pixel is made up of three or four components such as red, green, and blue (RGB), or cyan, magenta, yellow, and black (CMYK). Components are also referred to as sub-pixels/subpixels. Throughout this document we refer to bits-per-component (bpc), which is also known as bits per subpixel.

The Viewing Angle is the angle formed on either side of a bias angle, where the contrast of the display is still considered acceptable, which is typically +/−20°.

PAL is an abbreviation for Phase Alternate Line, which is a video format standard used in many European countries.

NTSC is an abbreviation for National Television System Committee, which is a video format standard used in many American countries.

The present invention, which discloses a device and method of a Delta Sigma (ΔΣ) Pulse Density Modulation (PDM) for digital displays, is described in detail below in reference to the figures.

Figure 8:
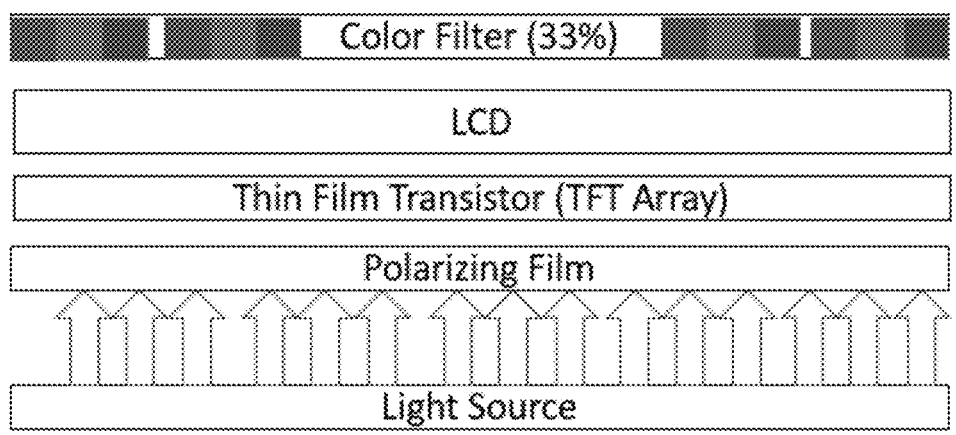
FIG. 8 illustrates a typical stack for LCD with color filters.
Figure 9:
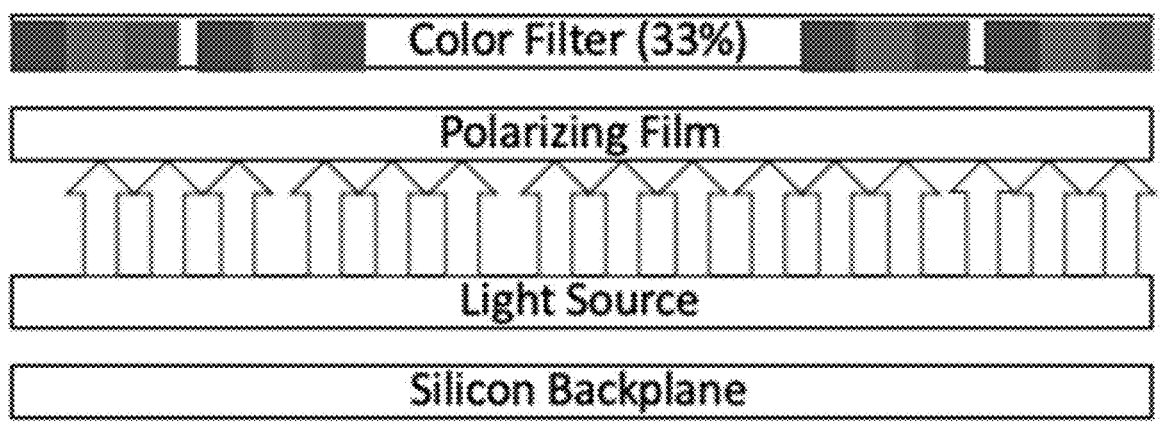
FIG. 9 illustrates a typical stack for a White OLED with color filters.
Figure 10:
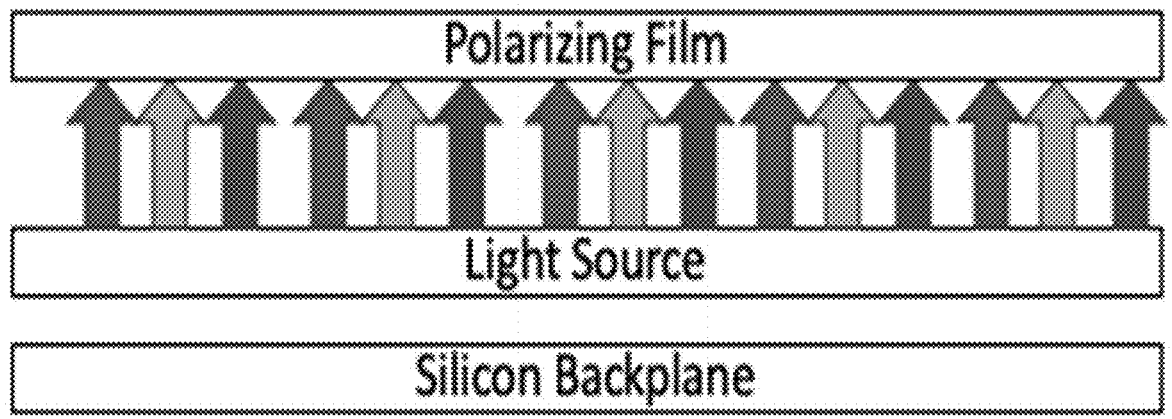
FIG. 10 illustrates a typical stack for RGB OLEDs without color filters.
Figure 11:
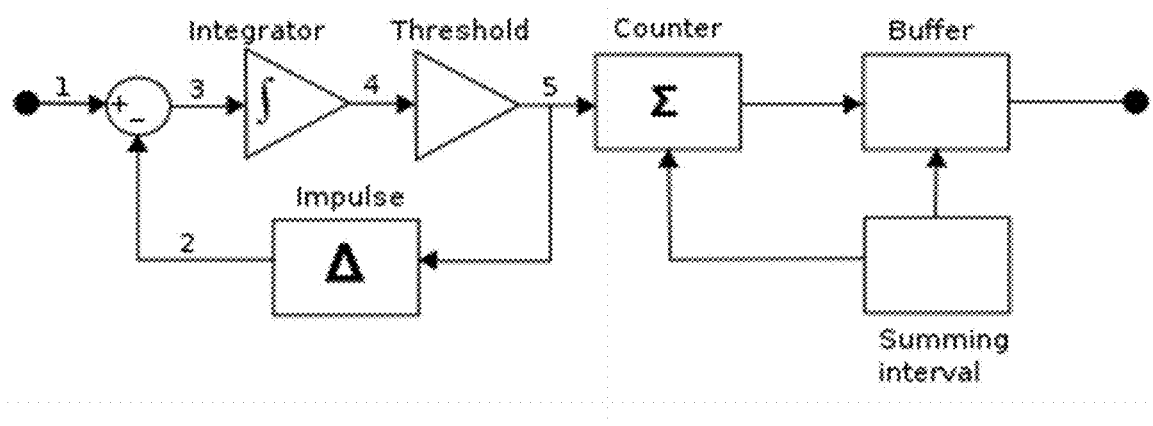
FIG. 11 illustrates a standard Delta Sigma digital circuit used for compact disc (CD) audios.

FIGS. 1-7 illustrate the present invention. FIG. 8, FIG. 9 and FIG. 10 respectively illustrate a typical stack for LCD with color filters; a typical stack for a White OLED with color filters; and a typical stack for RGB OLEDs without color filters. FIG. 11 shows a traditional ΔΣ block diagram used when making audio compact discs (CD).

Figure 1:
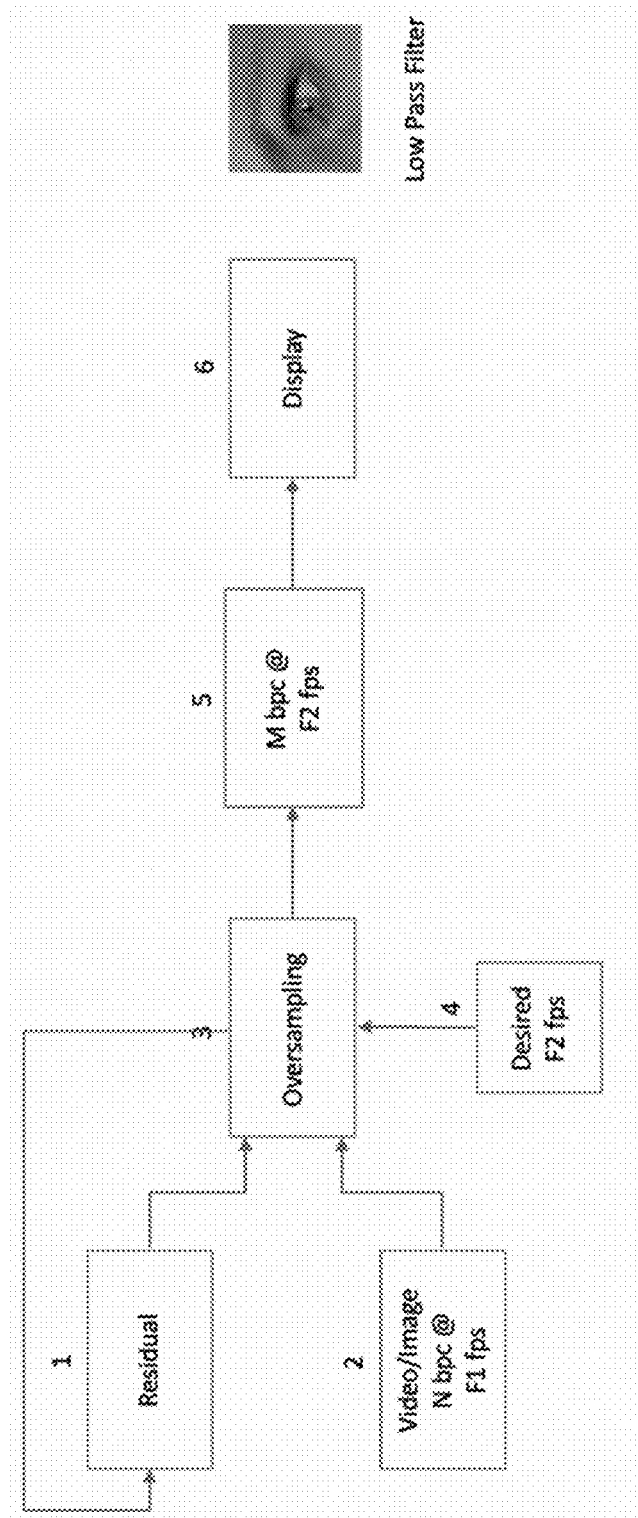
FIG. 1 is the diagram showing components of the image processing system

FIG. 1 is the system used in this invention. As shown in FIG. 1, a video/image (2) is inputted into the system. The inputted video/image (2) can be any (N) bit-per-component (bpc) at any F1 frame rate per second (fps). Each pixel location in the video/image has a value. The output will be at a new value using M-bpc at F2 fps. The ratio of F2/F1 is the oversampling frequency. As the oversampling frequency increases, fewer bits-per-component (M) are needed to display the video. The temporal average of the M-bpc values at the oversampling frequency represent the N-bpc value.

When comparing the present invention to a traditional ΔΣ block diagram of FIG. 11, input 1 is the video input; an impulse is the Residual. Counter is the Oversampling output. Summing Interval is M-bpc at F2. Buffer is a low pass filter (the human eye or camera).

Figure 2:
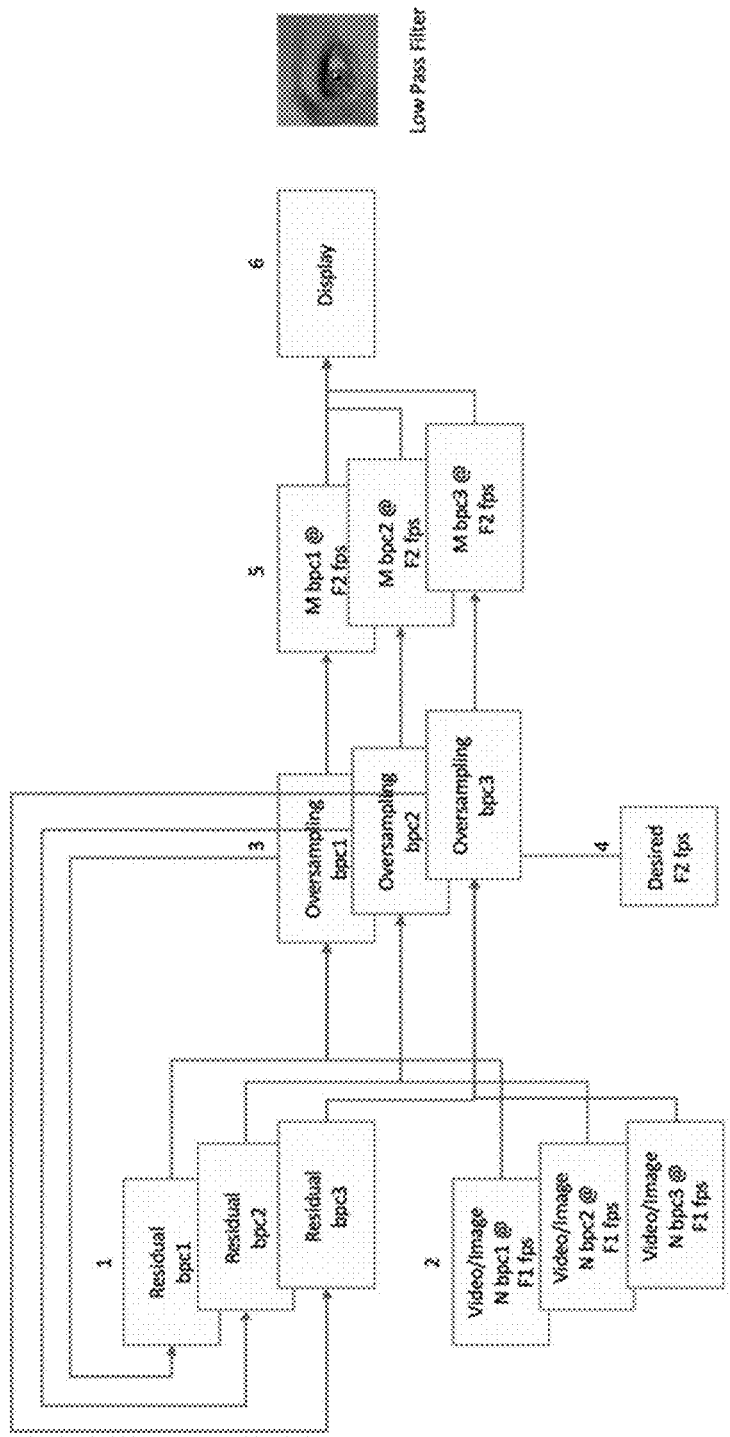
FIG. 2 is a diagram showing components of the image processing system particularly showing per component delta sigma compression flow.

FIG. 1 and FIG. 2 is described in more detail below.

Reference number 1 is a residual from the previous iteration. The first iteration is pre-defined. A good first-order approximation of the residual is a distribution of a random number across the image. The residual is divided into its color components. The color components can be any color space like RGB (Red-Green-Blue) or CMYK (Cyan-Magenta-Yellow-black). These components are often termed sub-pixels/subpixels.

Reference number 2 is a video/image. The video is also divided into its color components. The video can be inputted at any frame rate F1 (0=still image; 15 fps, 24 fps, etc.).

Reference number 3 is oversampling module. The oversampling module can be implemented in many different ways depending on the underlying hardware. A common way is to use an N-bpc adder. Box 1 is added to Box 2 for each component. If the summation overflows the N-bpc adder, then the output value is incremented. For example, if M=1, the video input is 81 (0-255 range), the residual from the previous frame is 200 (0-255 range), then the summation=281 (0-255 range). This creates an overflow; output value=1 and the residual for the next iteration=26. The output value, defined in M-bpc, does not define a color level per frame. ΔΣ PDM is frame less. Instead, the M-bpc values are integrated over time by the eye to form the image. The M-bpc values averaged over the oversampling frequency will approximate the original input video at N-bpc. They will be equivalent if the oversampling frequency is high enough as show in Tables 1 and 2.

Reference number 4 is the module providing the desired F2 fps. F2 is nominally set to the display's frequency and M is set to achieve the desired goal. The goal may be equivalency, bandwidth reduction, power reduction, or Mura correction.

Reference number 5 is an output value in M-bpc. In our example, the value=1.

Reference number 6 is an output to the display that will show the value M.

Reference number 7 is a low pass filter which will integrate the output values over time. Nominally, this is a human eye. The low pass filter can alternatively be a camera running at the input frequency (F1) or alternatively any device that performs low pass filter function.

FIG. 3 illustrates the oversampling built using an N-bit adder (3). The description is the same as FIG. 1 and FIG. 2.

Figure 4:
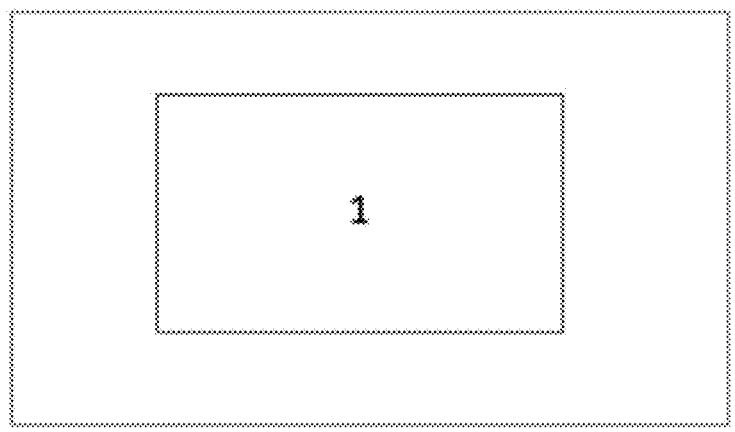
FIG. 4 is a schematic diagram showing that the display can be divided into any number of segments as Delta Sigma PDM is frameless.
Figure 4:
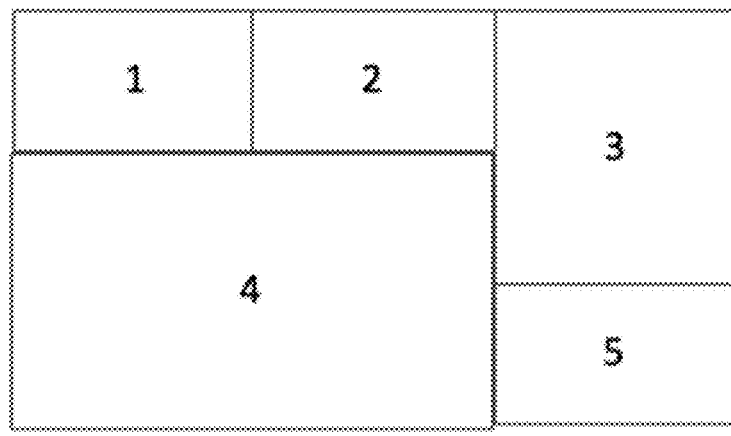

FIG. 4 illustrates how image (2) is divided. The invention divides the image into sections 1 through 5. For example, the sections 1 through 5 of the divided images can be an inner and outer, the top image in FIG. 4, or any rectangular pattern, the bottom image in FIG. 4. Since ΔΣ PDM has no spatial properties, the M-bpc can be different in each rectangular region. This provides further flexibility.

Figure 5:
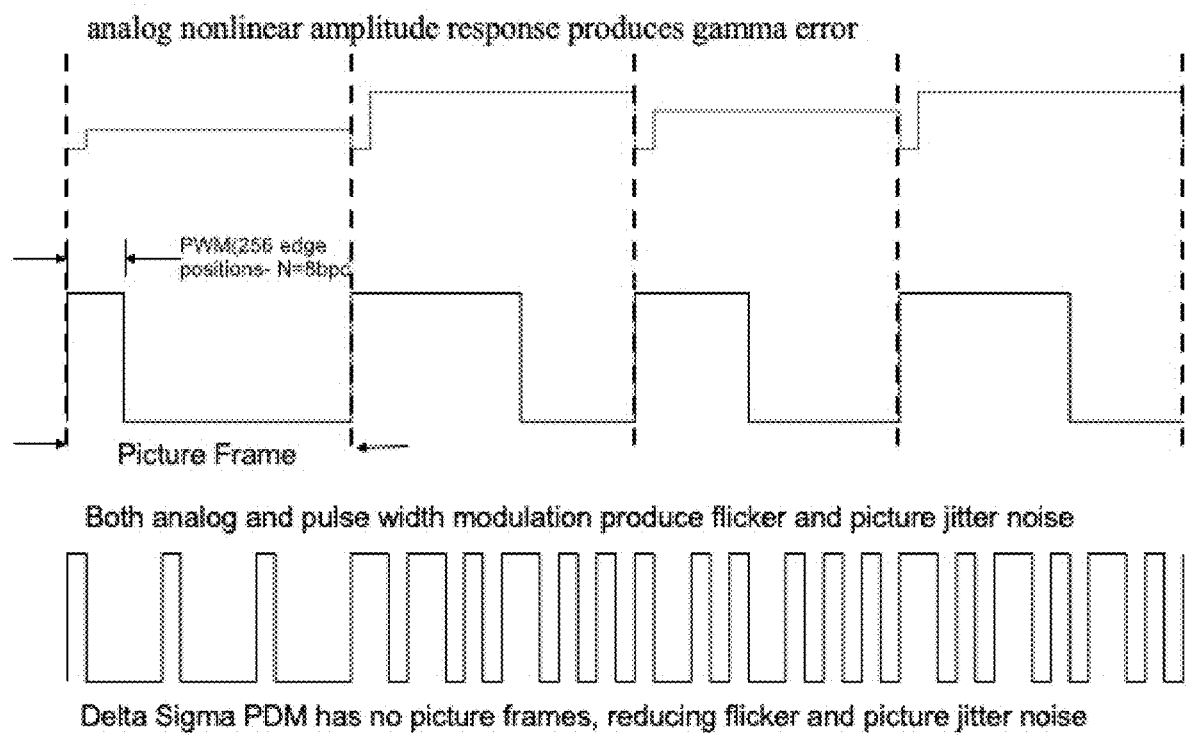
FIG. 5 illustrates the differences between PWM and Delta Sigma PDM.

FIG. 5 illustrates PWM breaks an image down into $2^N$ steps (N=8 in this example) and sends an equal width pulse for each step size. Since ΔΣ PDM integrates over time, the pulses are frame-less, not equal in size, and take less time to resolve. In this example, M=4.

Figure 6:
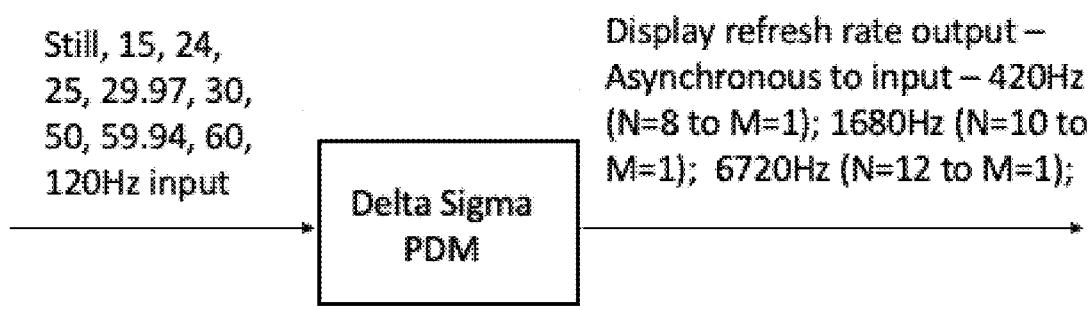
FIG. 6 illustrates that Delta Sigma PDM is asynchronous input to output.

FIG. 6 illustrates the asynchronous input to output of the Delta Sigma PDM. A video is inputted at a given frame rate. After ΔΣ PDM, the output is asynchronous from the input.

Figure 7:
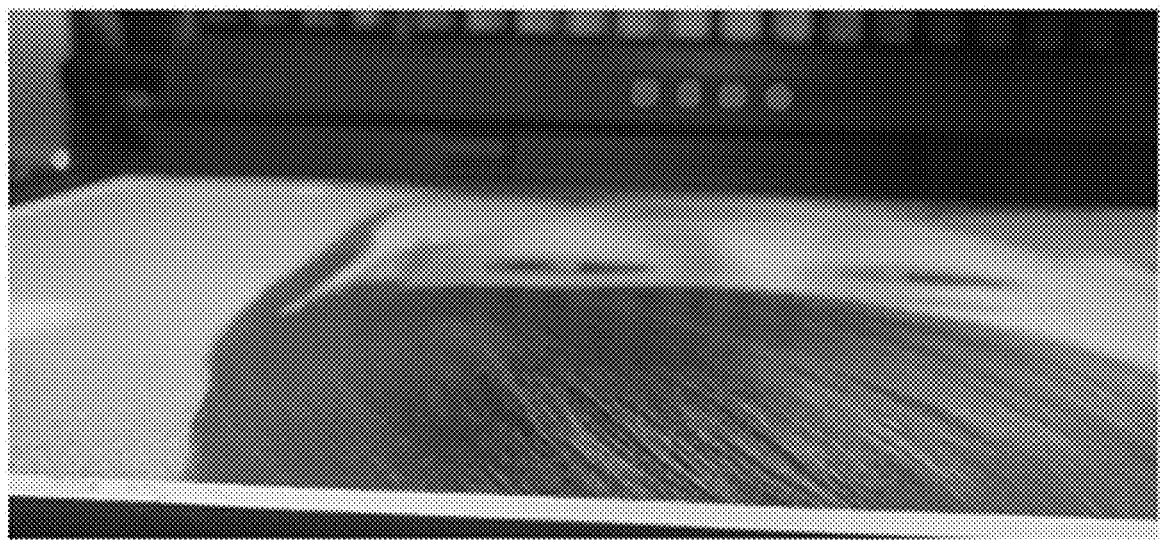
FIG. 7 illustrates a M=1 image shown at 90° relative to the center axis of the display.

FIG. 7 illustrate color non-inversion. The picture has been taken parallel to the display. The camera is acting as the low pass filter and M=1.

FIG. 8 illustrates a typical stack for LCD with color filters. Generally, 5-10% of the light from the light source gets through the stack. Most of the light is lost in the color filter (66%) as the filter blocks the Blue and Red light to allow Green through and similar actions to allow Red and Blue through.

FIG. 9 illustrates a typical stack for a White OLED with color filters which is easier to manufacture and the LCD, but the color filter loses 66% of the light.

FIG. 10 illustrates a typical stack for RGB OLEDs without color filters. This stack is difficult to manufacture and suffers from color uniformity issues, mainly due to the blue color.

FIG. 11 illustrates a traditional ΔΣ block diagram for building audio compact discs (CDs).

We claim:

1. An image processing system comprising an oversampling module wherein an N bits-per-component image or video is converted to an M bits-per-component image or video using an oversampling frequency, wherein the oversampling frequency is a ratio of an incoming video frequency and a refresh frequency of a display,
wherein the N bits-per-component image or video is displayed at M=1 bpc, which improves a viewing angle.

2. The image processing system of claim 1, wherein the N bits-per-component image or video is displayed on the display over time after being converted to the M bits-per-component image or video.

3. The image processing system of claim 1, wherein the N bits-per-component image or video having a frequency F1 is displayed at a frequency F2; wherein the frequency F1 is a National Television System Committee (NTSC) and the frequency F2 is a Phase Alternate Line (PAL).

4. The image processing system of claim 1, wherein by using the N bits-per-component image or video non-uniform (mura) is eliminated and the M-bits-per-component image or video at a frequency F2 creates substantially equivalent image or video to an image or video having N bits-per-component at a frequency F1 where N bits-per-component at the frequency F2 is not possible to achieve due to display driver constraints.

5. The image processing system of claim 1, wherein the N bits-per-component image or video displays High Dynamic Range (HDR) content and M bits-per-component at a frequency F2 creates an equivalent to image or video having N bits-per-component at a frequency F1 wherein N bits-per-component at the frequency F2 is not possible to achieve due to display driver constraints.

6. The image processing system of claim 1, wherein a brightness of the display is increased by setting M is less than or equal to N and creating an equivalent image to an image having N bits-per-component at a frequency F1 and a total power $P_{total}$ is kept constant and a $P_{step}$ is increased.

7. A method of displaying an image or video in a system, where the method comprising the steps of:
providing a video or an image to the image processing system of claim 1;
adding a residual to the video or the image;
applying a result of addition of an another residual to the first video or the first image to an N-bit register;
applying a signal having a frequency F2 into the N-bit register;
obtaining the M bits-per-component image or video, wherein each pixel has M-bit per component at the frequency F2 where M is less than or equal to N;
applying the M bits-per-component video or image to a display;
providing a low pass filter for filtering the M bits-per-component image or video.

8. The method of claim 7, wherein by using the N bits-per-component video or image, non-uniform (mura) is eliminated and the M bits-per-component at F2 creates an equivalent image to N bits-per-component at a frequency F1 where an image having N bits-per-component at the frequency F2 is not possible due to display driver constraints.

9. The method of claim 7, the N bits-per-component video displays High Dynamic Range (HDR) content and the M bits-per-component at the frequency F2 creates an equivalent image to an image having N bits-per-component at a frequency F1 where N bits-per-component at the frequency F2 is not possible due to display driver constraints.

10. The method of claim 7, further comprising:
setting M being less than or equal to N and creating an equivalent to an image where the image has N bits-per-component per pixel at a frequency F1 and a $P_{total}$ is reduced by $2^N/2^M$ ($P_{total}=P_{step}*2^N$).

11. The method of claim 7, wherein a brightness of the display is increased by setting M being less than or equal to N and creating an equivalent image to an image where the image has N bits-per-component per pixel at a frequency F1 and a $P_{total}$ is kept constant and a $P_{step}$ is increased.

12. The method of claim 7, further comprising: partitioning the video or the image and setting the M bits-per-component different throughout the video or the image therefore reducing a required bandwidth.

13. An image processing system comprising an oversampling module wherein an N bits-per-component image or video is converted to an M bits-per-component image or video using an oversampling frequency, wherein the oversampling frequency is a ratio of an incoming video frequency and a refresh frequency of a display,
wherein a reduced power display is created by setting M to be less than or equal to N and creating an equivalent image to N bits-per-component at a frequency F1 and a total power $P_{total}$ is reduced by $2^N/2^M$ ($P_{total}=P_{step}*2^N$).

14. An image processing system comprising an oversampling module wherein an N bits-per-component image or video is converted to an M bits-per-component image or video using an oversampling frequency, wherein the oversampling frequency is a ratio of an incoming video frequency and a refresh frequency of a display,
wherein a bandwidth is reduced by partitioning the image and setting M bits-per-component different throughout the image.

* * * * *